May 20, 1969 T. G. MAPLE 3,445,727

SEMICONDUCTOR CONTACT AND INTERCONNECTION STRUCTURE

Filed May 15, 1967 Sheet 1 of 2

INVENTOR
TELFORD GRANT MAPLE
BY [signature]
AGENT

INVENTOR
TELFORD GRANT MAPLE
BY [signature]
AGENT

1

3,445,727

SEMICONDUCTOR CONTACT AND INTERCONNECTION STRUCTURE

Telford Grant Maple, Woodside, Calif., assignor to Raytheon Company, Lexington, Mass., a corporation of Delaware Filed May 15, 1967, Ser. No. 638,341
Int. Cl. H02b *1/02, 9/00;* H01l *5/00*
U.S. Cl. 317—101 16 Claims

ABSTRACT OF THE DISCLOSURE

A semiconductor device having gold contacts alloyed to a silicon body, and interconnections comprising chromium-gold metallizations with nickel barriers and with selected portions of the gold content of the metallizations being removed to form chromium resistors lying on the surface of the device between gold interconnections.

*Background of the invention*

In conventional semiconductor devices, aluminum has been commonly used for contact metallizations to which gold wires are usually connected to make connections between the metallizations on the semiconductor device and the pads or pins of the completed semiconductor package. This is true in the manufacture of diodes or transistors and is also true in the case of integrated circuits where interconnections are made in the same manner between active areas of the device. Aluminum and gold are capable of reacting to form several intermetallic compounds and the rate of reaction is sufficiently rapid at elevated temperatures such as are commonly used in die attaching and lead bonding of semiconductor devices that problems are frequently encountered with interphase voids or other defects resulting in interruption of the electrical continuity of the aluminum-gold combination.

One method of avoiding this difficulty has been the substitution of aluminum wire for the gold wire and the employment of ultrasonic techniques for bonding the aluminum wire to aluminum pads on the device. However, difficulties are still encountered as the result of poor contact between aluminum metallizations and the silicon body. This problem is particularly encountered when the silicon body is heavily doped with boron, which is commonly used as a diffusant to control semiconductor type and resistivity in device fabrication. Contacts have also been found to deteriorate, especially when stored at elevated temperatures.

Some of the problems are avoided by the use of chromium-gold interconnections where a thin layer of chromium is used to bond the subsequently deposited thicker layer of gold to the silicon oxide surface of the device. This has been done by providing apertures in the silicon oxide at selected spots prior to the chromium and gold depositions. After the chromium-gold interconnections have been shaped by etching to the desired pattersn, the device is heated to a temperature above the silicon-gold eutectic temperature of 370° C. The gold then diffuses through the chromium and alloys with the silicon which is exposed within or beneath the aperture. However, difficulties have been experienced when the device is held too long at the eutectic temperature or when the temperature considerably exceeds 370° C., since then more silicon is dissolved by the eutectic melt. It will be apparent that the silicon diffuses toward the unreacted gold, and in doing so, more gold is taken up by the melt and eventually the entire interconnection pattern may be converted to a melt. The pattern can then contract under the influence of surface tension, producing unwanted interruptions or open circuits in the pattern. It is not necessary for all the gold to be converted to eutectic for such interruptions to occur, since difficulties have been experienced whenever the gold converted to eutectic is only slightly larger than the aperture. Even when successful alloying is accomplished without damaging the interconnections, damaging may occur during subsequent die attach or lead bond operations which employ temperatures above the eutectic temperature, frequently near 450° C. Attempts have been made to minimize such damage by increasing the thickness of the chromium layer, but then often the chromium acts as such a protective barrier that poor alloying occurs, resulting in appreciable contact resistance which degrades the electrical performance of the device.

2

*Summary of the invention*

The present invention overcomes the above and other deficiencies of the prior art by the provision of an intermediate layer of nickel which acts as a barrier to the diffusion of gold and silicon at usual processing temperatures. Such a nickel barrier permits longer bonds and higher temperatures to be employed in subsequent fabrication and assembly operations without deleterious effects.

Other objectives and advantages of the invention will become apparent from the following description taken in connection with the accompanying drawings.

*Description of the preferred embodiments*

Figure 1:
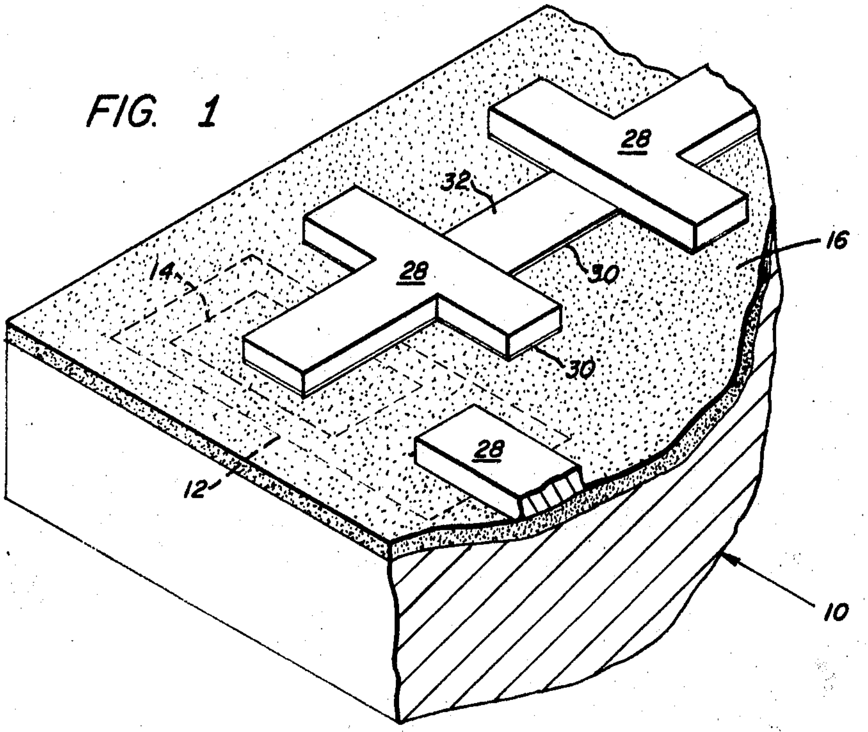
FIG. 1 is a fragmentary view of a semiconductor device embodying a preferred form of the invention.

In the manufacture of a circuit device of a type shown in FIG. 1, there is first provided a single crystal silicon chip or wafer which preferably has a resistivity of about .01 ohm/cm. and less than about 2000 dislocations per square centimeter. The single crystal wafer or chip is suitably doped in any well-known manner to provide it with selected N- or P-type conductivity characteristics and of such concentration of dopant as will provide the desired resistivity. If it is desired that the crystal be N-type, it is doped with arsenic, antimony, phosphorus, or other N-type dopant in an amount sufficient to provide it with the desired resistivity. In the event that the wafer is to be P-type, it will be doped with boron to provide it with P-type conductivity characteristics, as is well known. Into the crystal is then diffused an amount of a selected dopant which will form in the crystal a diffused area of the opposite conductivity type. The initial crystal material will be considered the collector of a transistor or other semiconductor device being produced, while the diffused region will be considered the base region. Then, to complete the fabrication of a transistor, a selected dopant will be then diffused or otherwise implanted into the base region to form an emitter region. This is done by conventional semiconductor technology. Accordingly, additional details of the method of forming the emitter, base and collector regions in a semiconductor crystal or wafer are believed unnecessary here.

After the device has been fabricated as described above, the entire surface of the device is covered with a layer of silicon oxide. The oxide is apertured immediately above the emitter and base surfaces and suitable metallization is applied so that interconnections may be made from the emitter and the base to other active elements or to elements externally of the device. This is commonly done by depositing controlled layers of aluminum, which aluminum overlies the oxide and extends into the apertures so as to contact the emitter and base regions. Thereafter, the metallizations are connected into suitable circuitry by means such as gold wires or other desired methods.

Referring now to FIG. 1, there is shown a portion of an integrated circuit which embodies a silicon crystal or wafer 10 into which has been diffused a base region 12. Into base region 12 has been diffused an emitter region 14. Over the entire surface of the device is applied a coating of silicon oxide. The silicon oxide coating is shown in the drawings as layer 16. Oxidation may be accomplished by any of the known thermal growing, RF sputtering, vapor plating or other oxidation techniques to form the silicon dioxide film to a thickness of, typically, about one micron. In order that electrical contact may be made to the emitter and base regions, windows or apertures are provided in the oxide layer directly over the surface of the region 12 whereby such surface is exposed. In order to do this, the oxidized surface is coated with a photoresist material such as the solution known as KPR, sold under that terminology by Eastman Kodak Company, for example.

The particular masking technique used here is not in itself unique insofar as this invention is concerned and, therefore, will only be briefly described herein. A photographic film is prepared with the desired pattern thereon, and the surface of the device is provided with a layer (not shown) of photoresist material, such as KPR, which overlies the oxide-coated surfaces of all three emitter, base and collector regions. This layer is exposed through the film to ultraviolet or other radiation to which it is sensitive, and developing takes place by dipping the device in a solution such as trichloroethylene to remove unexposed KPR. The device is then baked at about 150° C. for about 10 minutes, whereupon the oxide supports thereon a resultant hardened photoresist mask having a pattern which includes apertures over the emitter and base diffusions 12 and 14.

Figure 3:
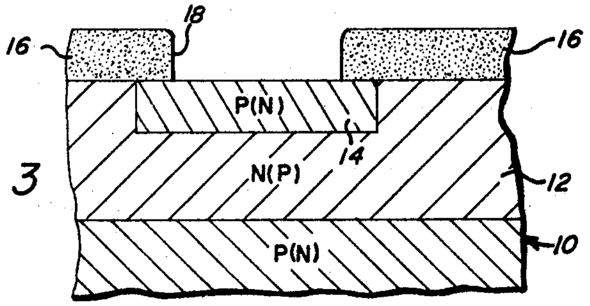
FIG. 3 is an enlarged fragmentary sectional view illustrating in detail the emitter-base portion of the device shown in FIG. 2 and further illustrating the silicon oxide coating covering the junction between the emitter and base regions.

The silicon dioxide 16 is then removed in the exposed areas of the photoresist pattern by placing the device in a solution containing about one part of hydrofluoric acid (HF) and nine parts of ammonium fluoride ($NH_4F$) to etch away the exposed areas of silicon dioxide, following which it is rinsed in water and dried. The remaining photoresist may now be removed by a solution of one part sulphuric acid and nine parts of nitric acid at about 100° C. for about 10 minutes. The device at this stage appears as shown in FIG. 3 wherein a window 18 is provided in the oxide layer 16 directly over the emitter region 14. A corresponding opening (not shown) overlies a portion of the base region 12.

Figure 4:
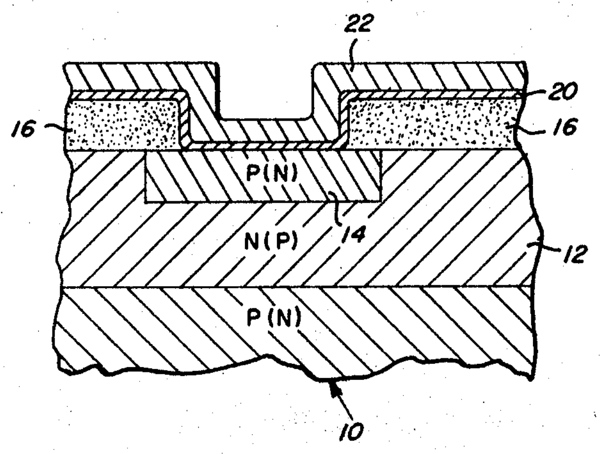
FIG. 4 is an enlarged fragmentary sectional view similar to FIG. 3 illustrating certain steps during the fabrication of the device.
Figure 5:
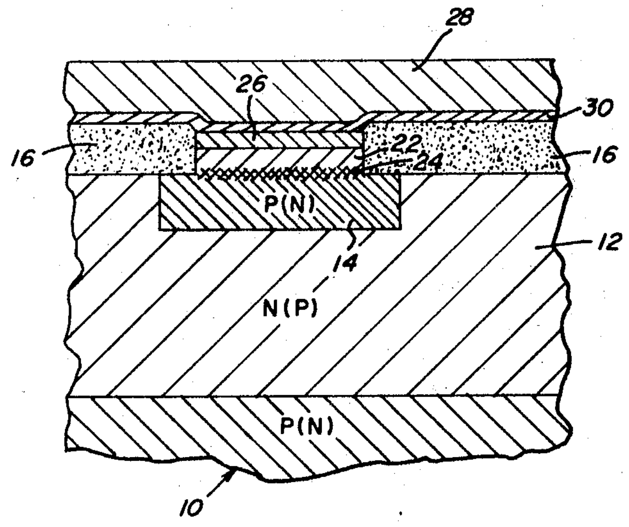
FIG. 5 is an enlarged fragmentary sectional view similar to FIG. 4 showing further steps during the process of manufacture of a device embodying the invention.

At this point, contacts are made to the emitter and base regions 14 and 12 by first exposing the device to a heated chromium source for about three seconds to form a layer 20 (FIG. 4) of chromium about 100 A. or less in thickness which overlies the oxide layer 16 as well as the exposed surfaces of the emitter and base regions 14 and 12. In FIGS. 4 and 5, the contact metallization to the emitter region 14 only is shown, but the base region 12 is simultaneously treated.

Over the chromium layer 20 is evaporated a layer 22 of gold. This is done by conventional evaporation techniques at a time-temperature cycle which produces the desired resultant thickness of the gold layer 22.

It is to be noted that layer 20 has been specified above as comprising essentially chromium. However, titanium, tantalum or molybdenum may be substituted for the chromium. Layer 20 is used primarily to obtain good adhesion of the gold to the silicon semiconductor material and to prevent lifting of the gold during subsequent processing.

The gold and chromium are then removed from all areas except the areas within the apertures 18 by photolithographic techniques which are well known. Briefly, to accomplish this the device is masked and the gold etched with an alkaline cyanide solution or a potassium tri-iodide solution, followed by etching of the chromium in dilute hydrochloric acid.

The gold is now alloyed to the silicon by exposing the device to a temperature of about 375–380° C. for about 10 minutes. The alloying takes place through the thin chromium layer 20, and the depth of alloying is about 0.3 micron. The alloy is indicated in FIG. 5 by the area designated 24. This forms the desired gold alloy contacts.

A nickel layer 26 is then deposited over the gold contacts 22 to a thickness of about 1000 A. This is preferably done by electroless plating or by any other desired process. Such plating is preferred, however, so that the nickel 26 will be deposited only upon the gold 22, and may be accomplished by immersing the device for about 2 minutes in a solution at a temperature of about 90° C. having the composition of 30 grams nickelous chloride, 50 grams ammonium chloride, 65 grams ammonium citrate, 10 grams sodium hypophosphite, 1 liter of water, to which has been added sufficient ammonium hydroxide to adjust and maintain the pH of the solution at 8.5–9.0.

Figure 2:
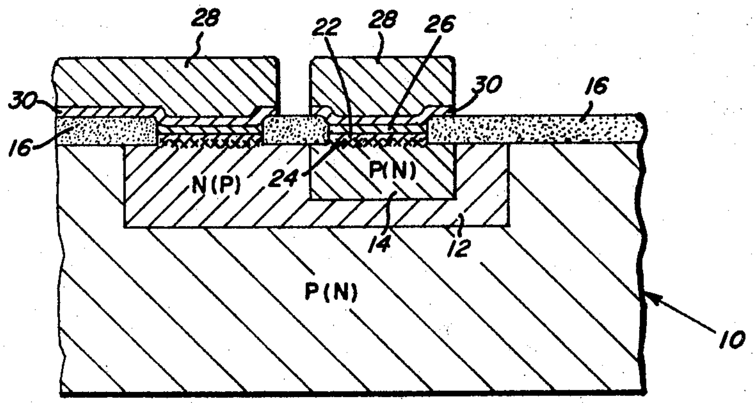
FIG. 2 is an enlarged fragmentary sectional view taken substantially through the center of an active transistor element embodied in the structure of FIG. 1.

At this point it is desired to provide metallized interconnections such as indicated at 28 in FIGS. 1, 2 and 5. To accomplish this a layer 30 of chromium, or of nickel-chromium alloy comprising about 80% nickel and 20% chromium, is evaporated over the top surface of the device, layer 30 being about 140 A. so as to have a resistivity of about 100 ohms./cm., or other thickness and resistivity desired. Then the gold interconnection layer 28 is similarly deposited over layer 30 to a thickness of about 5000 A. or more. The chromium or nickel-chromium layer 30 is used to obtain good adhesion of the gold and also to prevent alloying of the gold to the silicon during subsequent fabrication steps.

A photoresist is then applied in the desired pattern of the interconnections 28 plus the pattern of one or more resistors 32 (FIG. 1) which to be provided on the surface of the device. After developing the photoresist, gold is removed with a suitable etch such as the cyanide solution mentioned above. Then, the excess chromium or nickel-chromium alloy 30 is etched away by a 50% hydrochloric acid solution at room temperature, leaving a pattern as shown in FIG. 1. Then another photoresist is applied to only the interconnection areas, after which the gold is etched away from the resistor 32 area. The device is then given a suitable heat treatment to stabilize the nickel-chromium resistors 32. Alternatively to the heat treatment, resistor stabilization may be achieved by providing the device with an overcoating (not shown) of silicon monoxide with apertures therein to permit bonding wires to selected parts of the gold pattern.

From the foregoing it will be apparent that all of the objectives and advantages of the invention have been accomplished by the provision of the novel metal contacts and resistor elements as set forth. Changes may be made by those skilled in the art without departing fom the spirit of the invention as expressed in the accompanying claims.

What is claimed is:

1. A semiconductor device comprising a body of semiconductor material including at least two regions having conductivity characteristics different from each other, an insulating coating upon a surface of the body and having an aperture therein exposing a surface of one of said regions, a metal contact disposed within said aperture and alloyed to said exposed surface, a metallization covering selected portions of said insulating coating and extending over said metal contact, and means for preventing alloying of the metal contact to the body when the device is subjected to normal semiconductor processing temperatures comprising an intermediate layer of barrier metal disposed within said aperture between and physically connecting the metallization and the metal contact.

2. A semiconductor device as set forth in claim 1 wherein an electrically conductive layer is interposed between the metal contact and said exposed surface, the contact being alloyed to said exposed surface through said conductive layer.

3. A semiconductor device as set forth in claim 2 wrerein said barrier layer is a metal selected from the group consisting of chromium, titanium, tantalum and molybdenum, and said metal contact is gold.

4. A semiconductor device as set forth in claim 1 wherein said metallization comprises layers of chromium and gold.

5. A semiconductor device as set forth in claim 1 wherein said metallization comprises a layer of nickel-chromium alloy and a layer of gold.

6. A semiconductor device comprising a body of semiconductor material including at least two active elements, each including at least two regions of conductivity types different from each other, an insulating coating upon a surface of the body and having apertures therein exposing surfaces of at least two of said regions, a metal contact disposed within each of said apertures and alloyed to the respective underlying exposed surface, a metallization covering selected portions of said insulating coating and extending over said metal contacts, and means for preventing alloying of the metal contacts to the body during normal semiconductor processing techniques comprising an intermediate layer of barrier metal disposed within each of said apertures between and physically connecting the metallization and the respective metal contacts whereby said metal contacts are interconnected.

7. A semiconductor device as set forth in claim 6 wherein an electrically conductive layer is interposed between each metal contact and the respective underlying region, the contacts being alloyed to the underlying regions through said conductive layers.

8. A semiconductive device as set forth in claim 7 wherein said barrier layers are of a metal selected from the group consisting of chromium, titanium, tantalum and molybdenum, and said metal contacts are of gold.

9. A semiconductor device as set forth in claim 6 wherein said metallization comprises layers of chromium and gold.

10. A semiconductor device as set forth in claim 6 wherein said metallization comprises a layer of nickel-chromium alloy and a layer of gold.

11. A semiconductor device comprising a body of semiconductor material including at least two active elements each including at least two regions of conductivity types different from each other, an insulating coating upon a surface of the body and having apertures therein exposing surfaces of at least two of said regions, a metal contact disposed within each of said apertures and upon the respective underlying exposed surface, a metallization covering selected portions of said insulating coating and extending over and connecting said at least two metal contacts, said metallization comprising a first continuous metal layer, and a second non-continuous metal layer which covers selected spaced portions of said first metal layer including portions thereof which overlie and are connected to said contacts, the uncovered portion of said first layer being of controlled size to provide a resistor of predetermined electrical resistance characteristics.

12. A semiconductor device as set forth in claim 11 wherein said first metal layer is chromium and the second metal layer is gold.

13. A semiconductor device as set forth in claim 11 wherein said first metal layer is nickel-chromium alloy, and the second metal layer is gold.

14. A semiconductor device as set forth in claim 6 wherein said metallization comprises a first continuous metal layer, and a second non-continuous metal layer which covers selected portions of said first metal layer including portions which overlie and are connected to said metal contacts, the uncovered portion of said first layer being of controlled size to provide a resistor of predetermined electrical resistance characteristics.

15. A semiconductor device as set forth in claim 14 wherein said first metal layer is chromium and the second metal layer is gold.

16. A semiconductor device as set forth in claim 14 wherein said first metal layer is nickel-chromium alloy, and the second metal layer is gold.

References Cited

UNITED STATES PATENTS

| | | | |
|---|---|---|---|
| 3,231,421 | 1/1966 | Schmidt | 317—234.5 |
| 3,287,612 | 11/1966 | Lepselter | 317—234.5 |
| 3,290,127 | 12/1966 | Kahng et al. | 317—234.5 |
| 3,341,753 | 9/1967 | Cunningham et al. | 317—234.5 |
| 3,368,124 | 2/1968 | Ditrick | 317—234.5 |

LEWIS H. MYERS, *Primary Examiner.*

J. R. SCOTT, *Assistant Examiner.*

U.S. Cl. X.R.

317—234